United States Patent [19]

Smith et al.

[11] Patent Number: 5,571,429
[45] Date of Patent: Nov. 5, 1996

[54] APPARATUS AND PROCESS FOR HIGH SPEED LAMINATE PROCESSING WITH COMPUTER GENERATED HOLOGRAMS

[75] Inventors: Adlai H. Smith; Bruce B. McArthur, both of San Diego; Robert O. Hunter, Jr., Rancho Santa Fe, all of Calif.

[73] Assignee: Litel Instruments, San Diego, Calif.

[21] Appl. No.: 201,600

[22] Filed: Feb. 25, 1994

[51] Int. Cl.$^6$ .................................................. B23K 26/06
[52] U.S. Cl. ........................ 219/121.68; 219/121.73; 219/121.75; 219/121.8; 359/15; 264/400
[58] Field of Search ................... 219/121.67, 121.68, 219/121.69, 121.7, 121.71, 121.72, 121.73, 121.74, 121.75, 121.78, 121.82, 121.84, 121.86; 359/15, 205, 565; 264/22, 25, 400; 156/643.1; 216/65, 94; 430/5

[56] References Cited

U.S. PATENT DOCUMENTS

| | | | |
|---|---|---|---|
| 3,265,855 | 8/1966 | Norton | 219/121.71 |
| 3,617,702 | 11/1971 | Flournoy | 219/121.71 |
| 3,703,724 | 11/1972 | Thomas | 359/565 |
| 4,508,749 | 4/1985 | Brannon . | |
| 4,670,638 | 6/1987 | Pavlin | 219/121.78 |
| 4,707,596 | 11/1987 | Hohberg | 219/121.78 |
| 4,909,818 | 3/1990 | Jones | 219/121.68 |
| 5,160,823 | 11/1992 | Bennin et al. | 219/121.82 |
| 5,223,080 | 6/1993 | Ohta et al. | 156/643.1 |
| 5,223,693 | 6/1993 | Zumoto et al. | 219/121.75 |
| 5,296,673 | 3/1994 | Smith | 219/121.75 |
| 5,319,183 | 6/1994 | Hosoya et al. | 219/121.68 |
| 5,362,940 | 11/1994 | MacDonald et al. | 219/121.68 |
| 5,403,627 | 4/1995 | Wilbert et al. | 219/121.84 |

FOREIGN PATENT DOCUMENTS

| | | | |
|---|---|---|---|
| 0072609 | 2/1983 | European Pat. Off. | 219/121.74 |
| 0488033 | 6/1992 | European Pat. Off. | 219/121.73 |
| 3-134621 | 6/1991 | Japan . | |
| 1442002 | 7/1976 | United Kingdom | 219/121.67 |

OTHER PUBLICATIONS

Küper, Stephan, et al. (1992) "Ambient gas effects on debris formed during KrF laser ablation of polyimide", Appl. Phys. Lett., 60:1633–1635.

*Primary Examiner*—Teresa J. Walberg
*Assistant Examiner*—Gregory L. Mills
*Attorney, Agent, or Firm*—Townsend and Townsend and Crew LLP

[57] ABSTRACT

In an apparatus and process for the direct ablation of substrates, an optical train is disclosed which enables large substrates to be processed from relatively small optical masks containing subaperture groups. Optical masks, preferably in the form of transparent plates containing computer generated holograms, are provided with at least discrete subaperture groups for sequential scanning and hence sequential processing of the substrate. A scanning beam in combination with a variable aperture overlying the mask sequentially scans the subaperture groups of the plates to produce direct laser ablation from a subaperture group intended to be scanned and prevents partial scanning of adjacent subaperture groups. Specialized plates with overlying generally negative lenses and subapertures elongated with respect to the radial direction of optical divergence are utilized to project images out from under the respective computer generated holograms to locations at the side of the plates without distortion. The plates enable both ablation of local openings within the substrates as well as the preparation of surfaces surrounding such openings for both cleansing of the working surface of the substrate as well as preparation of the surface of the substrate for receipt of further processing such as plating. Excising of both completed circuits and areas on substrates is disclosed. A preferred embodiment includes a compression telescope combined with a preferred scanning mirror train to minimize mirror size with ablation from underneath a horizontally or vertically disposed substrate so that generated debris falling or cleaned from the substrate falls away from the processed product.

18 Claims, 10 Drawing Sheets

5,571,429

APPARATUS AND PROCESS FOR HIGH SPEED LAMINATE PROCESSING WITH COMPUTER GENERATED HOLOGRAMS

This invention relates to high speed processing of substrates such a polyimide with laser light. More particularly, an apparatus and process is shown which enables direct processing by laser for ablation of openings, such as vias or apertures, as well as substrate surface cleansing and preparation, preferably around the openings or on electrical connection tabs. An improved optical train for effecting the beam delivery in conjunction with a mask consisting of computer generated holograms is disclosed.

BACKGROUND OF THE INVENTION

In USE OF FRESNEL ZONE PLATES FOR MATERIAL PROCESSING, filed Jan. 3, 1994, Ser. No. 08/177,356, a Continuation-in-Part of Ser. No. 07/940,008 filed Sep. 3, 1992, now U.S. Pat. No. 5,362,940 which was a File Wrapper Continuation of Ser. No. 07/612,212 filed Nov. 9, 1990, now abandoned and assigned to the common assignee herein, the scanning of computer generated holograms utilizing a scanning beam of coherent light for the direct processing of a substrate—such as a polyimide layer—is disclosed. In this application, these processing techniques are improved upon and generalized for greater efficiency and effectiveness in processing.

Flex circuits are mechanically flexible electrical circuits. Such flex circuits find use in modern automobiles, computers, cameras, and other locations where flexible substrates make the required electrical connections in circuits. The working features required to be placed on the substrates for such flex circuits are not dense. Specifically, the features are relatively far apart.

Heretofore, such substrates have been manufactured without direct processing with light. Multi-step chemical processes have been utilized.

Direct laser ablation in the process steps of manufacture of such flex circuits has not been used to great advantage. First, large areas of the substrates are required to be processed. In most computer generated holograms (CGHs) the area of possible scan on the computer generated hologram is much smaller than the area which must be processed on such large substrates. Because of the disparate size difference between the area than can be optically scanned and the substrate that must be scanned, such direct processing has not been utilized.

SUMMARY OF THE INVENTION

An apparatus and process for the direct ablation of substrates, an optical train is disclosed which enables large substrates to be processed from relatively small optical masks containing subaperture groups. Optical masks, preferably in the form of transparent plates containing computer generated holograms, are provided with at least discrete subaperture groups for sequential scanning and hence sequential processing of the substrate. A scanning beam in combination with a variable aperture overlying the substrate sequentially scans the subaperture groups of the plates to produce direct laser ablation from a subaperture group intended to be scanned and prevents partial scanning of adjacent subaperture groups. Specialized plates with overlying generally negative lenses and subapertures generally elongated with respect to the radial direction of optical divergence are utilized to project images out from under the respective computer generated holograms to locations at the side of the plates without distortion. The plates enable both ablation of local openings within the substrates as well as the preparation of surfaces surrounding such openings for both cleansing of the working surface of the substrate as well as preparation of the surface of the substrate for receipt of further processing such as sputtering. Excising of both completed circuits and areas on substrates is disclosed. A preferred embodiment includes a compression telescope combined with a preferred scanning mirror train to minimize mirror size with ablation from a horizontally or vertically disposed substrate so that generated debris falling or leaned from the substrate falls away from the processed product. Furthermore, the ablation process is preferably carried out at low pressures.

DESCRIPTION OF THE PREFERRED EMBODIMENT

Figure 1:
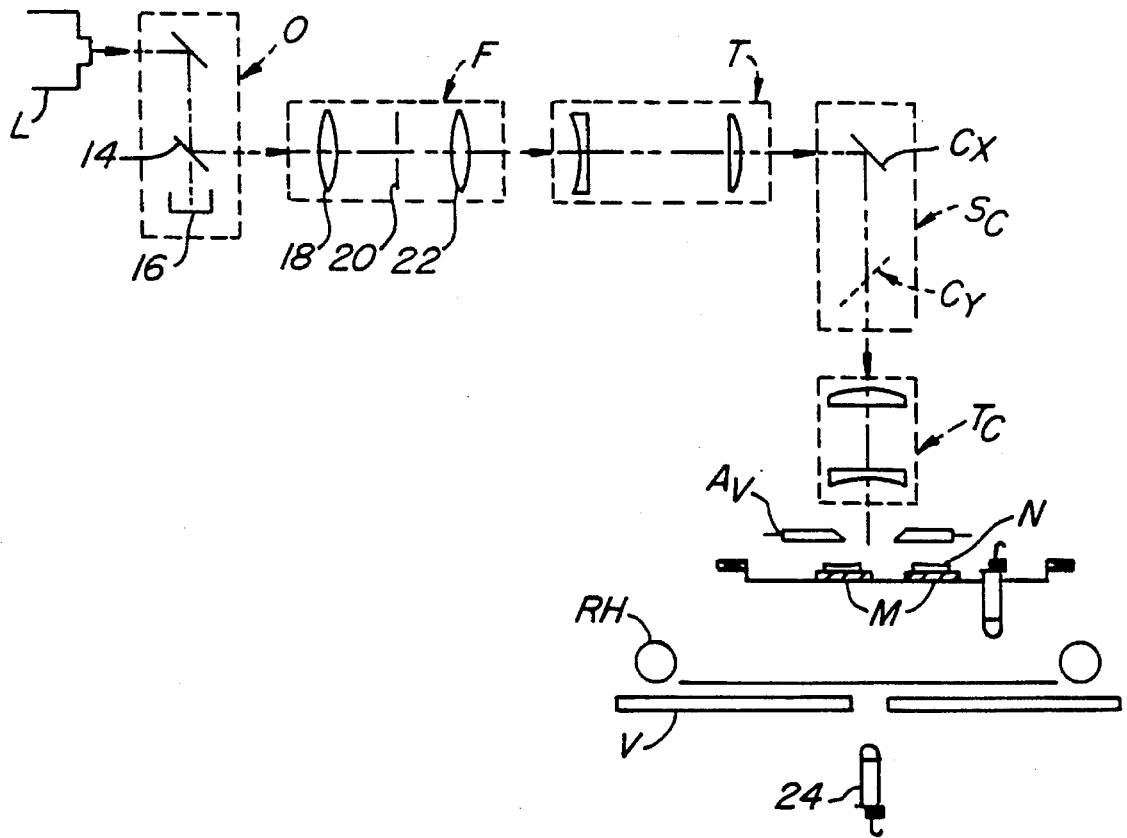
FIG. 1 is a schematic illustrating a light source, beam conditioning optics, scanning mirrors, a compression telescope, a variable aperture, masks with diverging negative lenses, and substrate reel handling equipment.

Referring to the schematic of FIG. 1, the apparatus and process for this disclosure is schematically illustrated. Laser L supplies a coherent beam to Z-path optics optics O which adjust and direct the beam into the main apparatus. Z-path optics O include partial beam splitter 14 and power meter 16 for measurement of the output of laser L.

Thereafter, the coherent light enters spatial filter F including lens 18, aperture 20, and lens 22. The filter beam then enters expansion telescope T, which is here illustrated of the Galilean variety. In addition to possibly expanding the beam size while maintaining collimation, telescope T also serves the function of removing any residual focus in the incident laser beam.

As will hereafter become apparent, it is necessary for the beam to scan masks M at least at subaperture groups G if not individual subapertures S. This being the case scanners $C_X$ and scanners $C_Y$ accomplish such scanning with an individual beam over the surface of masks M.

After scanning, entrance to compression telescope $T_C$ occurs. It is upon exit from compression telescope $T_C$ that incidence to masks M occurs.

Compression telescope $T_C$ allows high fluences of parallel light to be incident on mark M. High fluences being fluence levels (as measured in units of Joules/cm$^2$) that would otherwise damage coated dielectric or metal surfaces in the optical train. It is parallel transported along with the laser light by scanners Cx and Cy. If beam compression is not required, than $T_C$ is removed for the required processing.

After compression telescope $T_C$ light passes through variable aperture $A_V$. Variable aperture $A_V$ is illustrated in FIG. 2D configured with a rectangular shape for scanning one of the subaperture groups G illustrated in FIGS. 2A and 2B. As will hereafter become more apparent, variable aperture $A_V$ confines scanning to one subaperture group G to avoid adjacent subaperture groups G from being partially scanned.

Masks M are provided with negative lens N typically in contact with the mask. As will hereafter be made more apparent with respect to FIG. 3, the presence of negative lens N and the design of individual subapertures I on mask M enables working images W to be broadcast from mask M of narrow dimension to substrate S of wider dimension.

Substrate S is mounted on vacuum table V. Typically, this table can include a microscope/camera 24 which examines fiducials (not shown in FIG. 1) on substrate S through small openings in table V. Several such microscope/cameras may be so utilized.

It is important to understand the relative dimensions. Typically masks M are of a dimension about ·5 inches by 5 inches. Patterned area of substrate S however is considerably larger. Representative dimensions are 12" by 12".

Having set forth the general operating characteristics with respect to FIG. 1, attention will now be devoted to the explanation of this invention in detail. First, the construction of large area masks M will be set forth illustrating a typical configuration of subaperture groups G. Thereafter, variable aperture $A_V$ will be discussed with reference to its interaction with scanned masks M at subaperture groups G with prevention of partial scanning of subapertures of adjacent subaperture groups G. Next, the action of negative lenses N with individual subapertures I of masks M will be set forth to enable working images W is be broadcast out from under masks M the full width of substrate S.

Large Area Masks

Figure 2A:
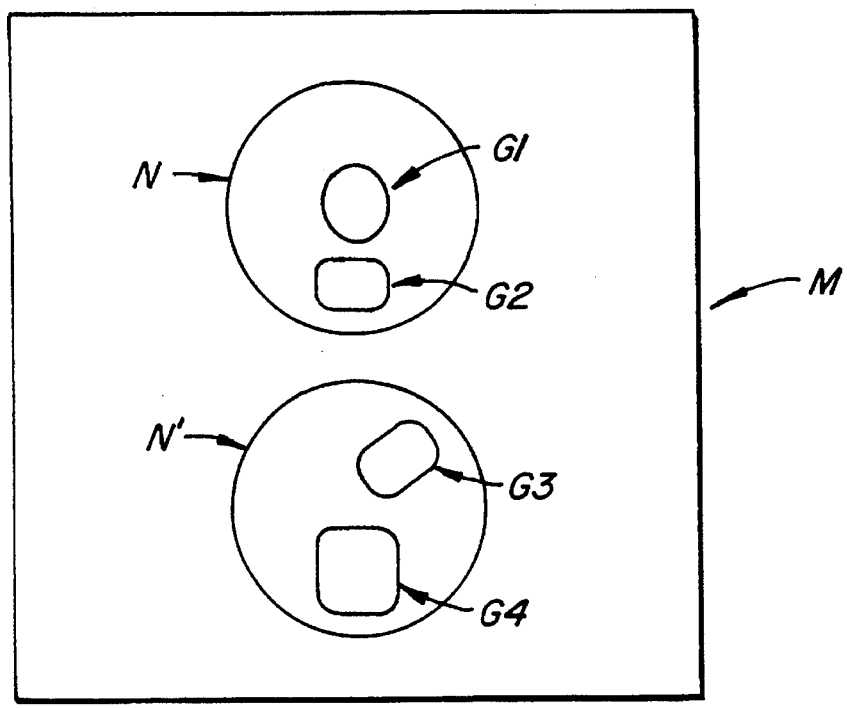
FIGS. 2A and 2B are respective overall and closeup views of one of the masks containing computer generated holograms for the purpose of ablating the processed substrate of this invention with FIG. 2A illustrating negative lenses overlying subaperture groups and FIG. 2B illustrating a detail of one of the subaperture groups.
Figure 2B:
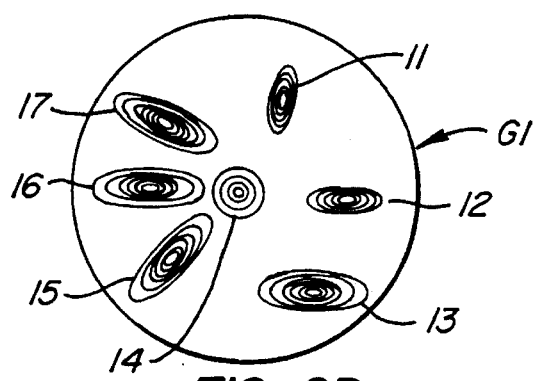

Referring to FIGS. 2A and 2B, in order to process at very high speed, it may be desirable to have very large masks. As a practical matter, where electron beam written computer generated holograms are utilized, plate dimension is typically restricted. Specifically, dimension of masks M typically cannot exceed about 6 inches by 6 inches. However, it will be understood that substrate S is of considerable larger dimension. Consequently, some scheme of enabling the smaller masks to address a larger area is required.

Figure 5A:
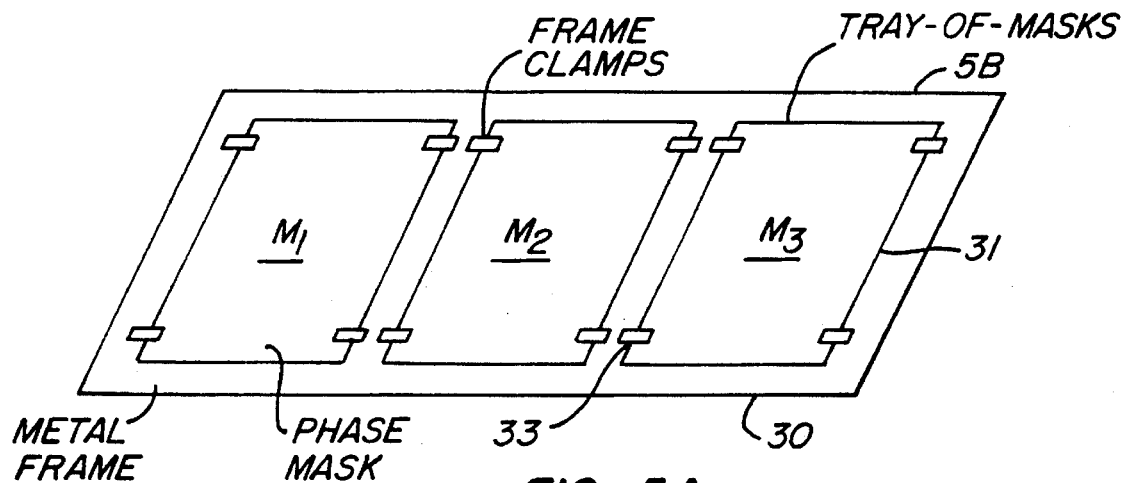
FIG. 5A is a perspective view of a multiple mask holder preferably used with this invention and FIG. 5B is a side elevation of the mask holder illustrating the side-by-side support of masks within the holder of the invention.
Figure 5B:
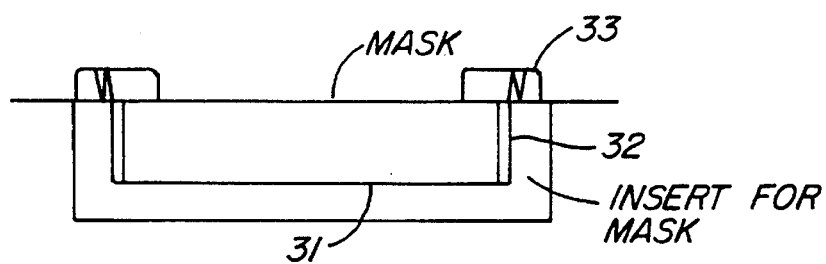

One way of accomplishing this is with a tray 30 containing three masks $M_1$–$M_3$ as illustrated in FIGS. 5A and 5B. Such a tray can be maintained stationary while the beam is scanned over its entire surface.

Referring to FIGS. 5A and 5B, the construction of tray 30 can be understood. Tray 30 includes three mask receiving concavities 31 which bound the sides of each mask at tray wall 32 and support the bottom of the mask adjacent the periphery of the mask. Mask clips 33 firmly hold each of mask $M_1$–$M_3$ in place. In the preferred embodiment, the masks M are square in dimension and are provided in units of two or more with scanning occurring sequentially to subaperture groups G on any individual mask M.

The design of an individual plate can now be set forth. In our Patent Application entitled Generalized Geometric Transforms for Computer Generated Holograms Ser. No. 08/175,052 filed Dec. 29, 1993 and assigned to the common assignee herein, we have set forth a procedure for the tiling of subaperture groups G and individual subapertures I. For complete details, reference is made to the above patent application which is incorporated herein by reference.

Referring to FIGS. 2A and 2B, a mask M consists of a computer generated hologram (CGH) containing two or more subapertures. This mask is usually transmissive—although it can be reflective. The mask contains optical features in side-by-side relationship which usually alter coherent light of a specific frequency on the plate in phase and amplitude. Such a CGH will produce at least one "working image"—an image formed from constructively interfering light in space at a working distance from the plate that is typically utilized to process materials. Such processing of materials is due to the exposure of the materials to the light of the real working images—usually causing ablation of vias or apertures.

In our immediately above referenced patent application, a technique for mapping working images to adjacently and continuously tiled subapertures having CGHs on a plate is disclosed with the result that the entirety of a plate is completely covered with working subapertures, these subapertures usually being rectangular.

The individual subaperture I size and shape is determined so that the patterned area on the CGH has a compact footprint occupying a minimum area. Any array of polygons contiguously tiled together so that their respective boundaries either form common boundaries with adjacent polygons or boarders to the working surface of a plate, will produce this desired condition. In a simplified and preferred tiling technique, rectangles of varying size and shape which fit together to form a single larger rectangle are the usual result. Other shapes which tile together conveniently are also possible including trapezoids, triangles, hexagons, and the like are included.

Figure 2C:
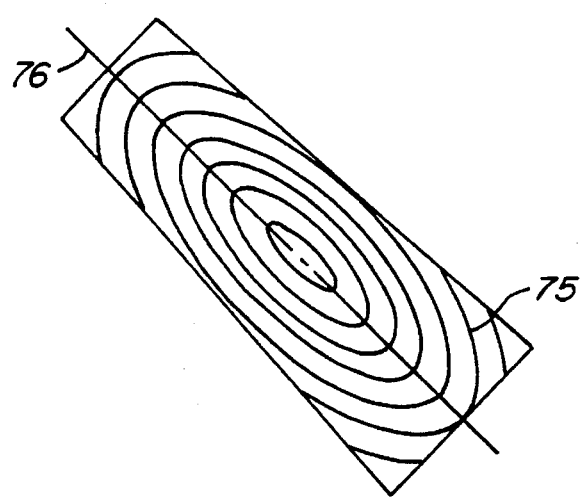
FIG. 2C is an enlarged view of a single individual subaperture illustrating its elongation along the radial direction of the overlying lens.
Figure 2D:
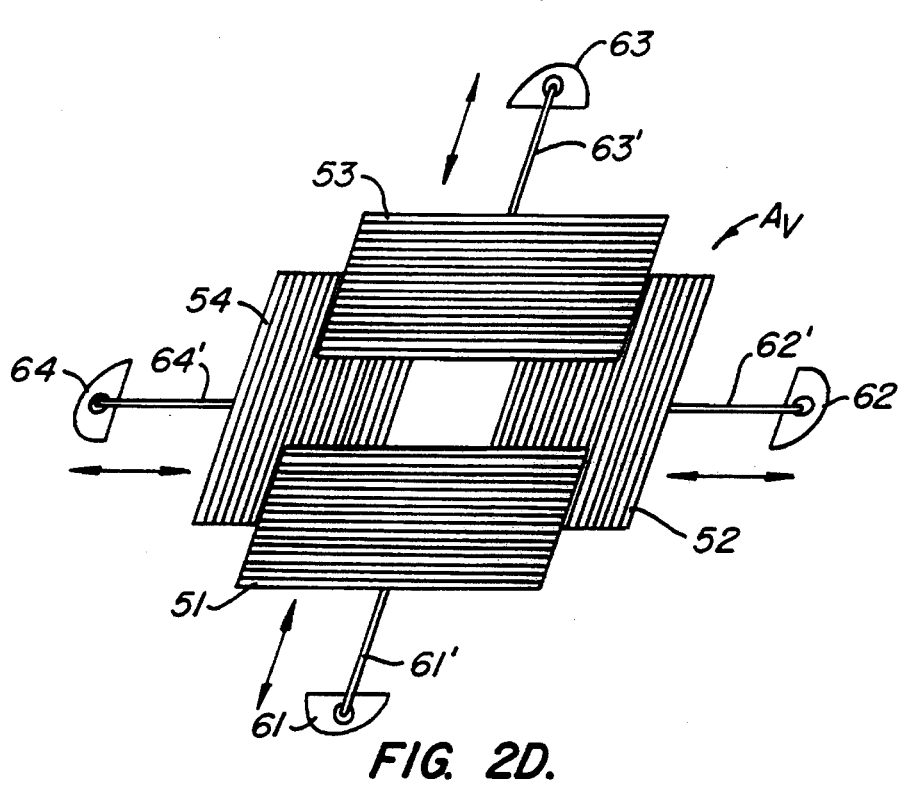
FIG. 2D is a schematic of a variable aperture apparatus, this apparatus here being shown to delimit a scanning beam to a rectangular area of one of the subaperture groups of FIGS. 2A and 2B.

Referring to FIG. 2C, an individual subaperture is illustrated. As will hereinafter become more apparent, this individual subaperture I is fabricated to work in cooperation with negative lens N in the broadcast of its working image W. Those having skill in the holographic art will realize that the computer generated hologram necessary for generating a point source or a cylindrical aperture has circular fringes. Referring to FIG. 2C, it will be seen that fringes 75 are more oval in shape. This elliptical configuration will cause two effects.

First, it will result in working image W being thrown radially of the major axis 76 of the ellipse with minimal distortion. Second, and when used in combination with negative lens N, the distortions resulting from the lateral broadcast parallel to major axis 76 are to a certain effect mutually canceled; what would be distortions introduced by negative lens N are canceled by the elongate individual subaperture I.

In the particular scheme here employed, each feature is distributed in an individual subaperture I. The reader will appreciate that other shapes may as well be used.

In FIG. 2A, immediately overlying mask M is negative lens N is shown in exploded relation. It is the purpose of negative lens N in combination with individual subapertures I to cause working images W to be projected out from the relatively narrow subaperture group G to the sides of substrate S.

It is submitted that this is a rather surprising result. Specifically, it has been found that with the lateral throw of images, aberration introduced by negative lens N is canceled by the array of optical features in individual subapertures I.

Having set forth the generally the construction of masks M, attention can now be devoted to variable aperture $A_V$.

Referring to FIG. 2D, variable aperture $A_V$ is illustrated. It here is shown including aperture shutters 51–54. Each of aperture shutters 51–54 is actuated in movement by shutter actuators 61–64. Respective actuators 61–64 are connected to aperture shutters 51–54 by connection rods 61'–64'. With differential movement between respective shutter actuators 61–64 each of aperture shutters 51–54 can assume variable position and thereby create rectangular apertures of varying size and position.

The reader will appreciate that we have only illustrated here a rectilinear variable aperture capability. It will be understood that we contemplate and required shape variable aperture $A_V$ necessary to appropriately confine ablating fluence to the required subaperture group. For example, circular "iris" variable apertures $A_V$ may be utilized.

The sequence of the scanning of the subapertures can now be understood. Specifically, variable aperture $A_V$ is configures so that its opening is over a subaperture group, such as subaperture group $G_2$. This configuration is such that no matter what configuration the scanners Cx and Cy may take, only subaperture group $G_2$ will be illuminated by the incident processing light. Thereafter, scanning occurs.

Figure 3:
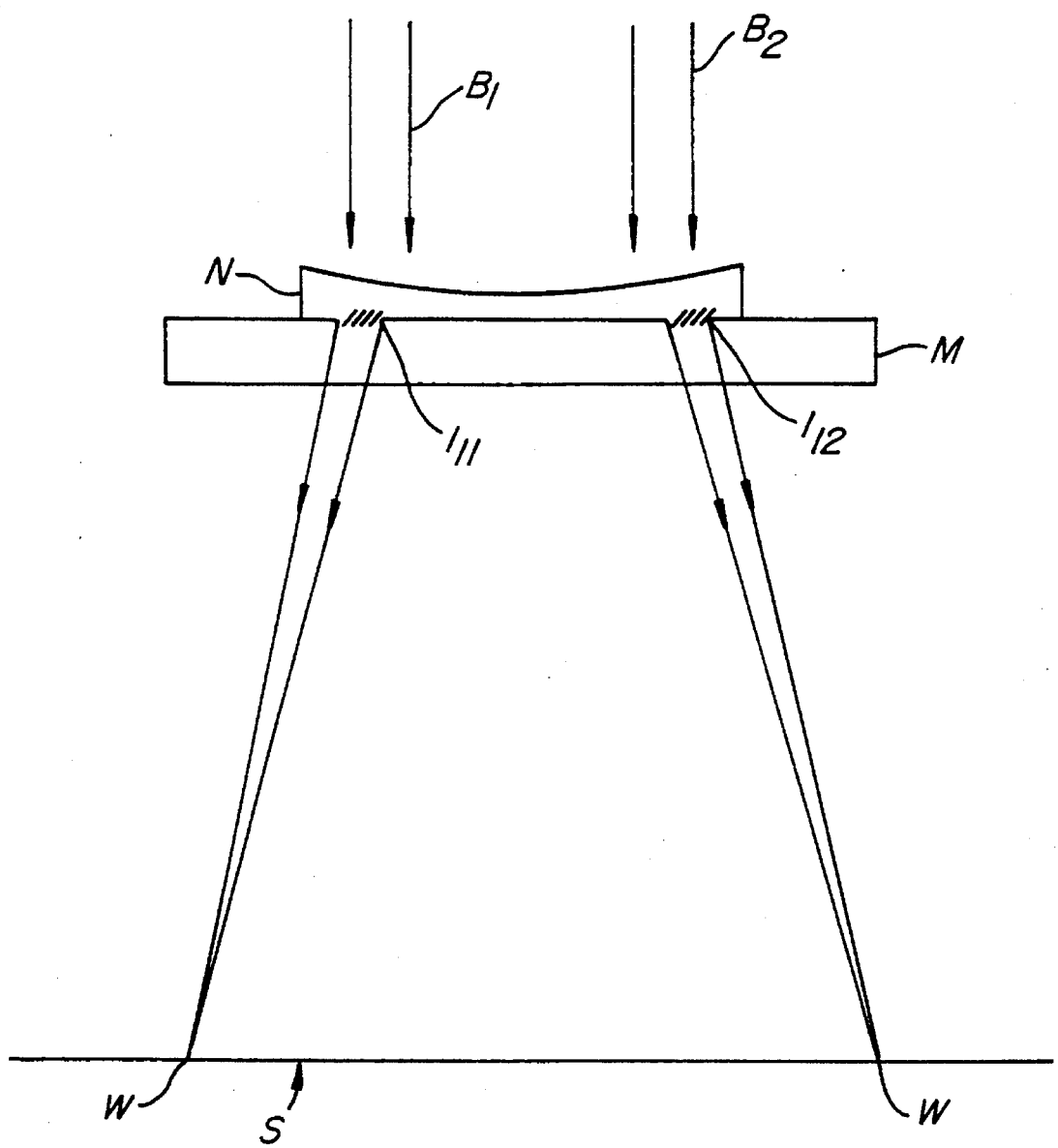
FIG. 3 illustrates two discrete subapertures having light incident thereon with a negative lens causing separation of the resulting images in accordance with the teachings of this invention.

Referring to FIG. 3, the optical effect of the scanning can now be understood. In FIG. 3, beam $B_1$ is shown scanning across mask M. It encounters individual subapertures $I_{11}$. When scanning proceeds further, the beam—in the position of beam $B_2$ encounters individual subaperture $I_{12}$. Negative lens N overlies mask M and in cooperation with individual subapertures $I_{11}$–$I_{12}$ causes propagation of the particular working images W of the respective subapertures to be broadcast to positions on either side of mask M on substrate S. Here the working images W are shown as essentially point sources; these would be the representative shapes if the respective features constituted vias through substrate S.

Of course, the beam scan can be programmed to optimally cover the surfaces. At the junction of the transparent mask mounting areas, the lenses may be designed to "throw" vias into regions shadowed by the mounting frame shown in FIGS. 5A and 5B.

It will be understood, that one particularly useful embodiment of this invention can utilizes multiple masks $M_1$–$M_3$ In addition to mechanically tiling up multiple masks, a single, monolithic substrate can be contact printed multiple times in different locations.

Figure 6A:
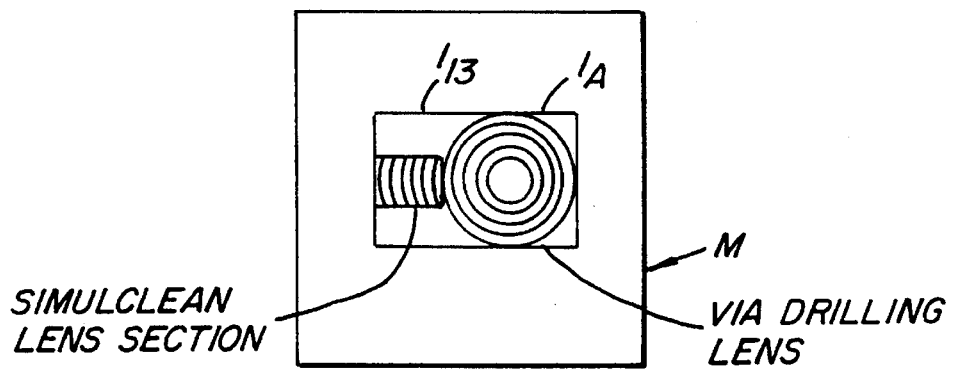
FIG. 6A is a schematic of two side-by-side mask subapertures of a subaperture group with the first mask subaperture illustrating the ablation of a central feature and the second mask subaperture ablating a surround relative to the ablated feature to produce an area which is both cleansed and ablated in preparation for further processing such as metal deposition and FIG. 6B is a schematic diagram of the mask and substrate during ablation.
Figure 6B:
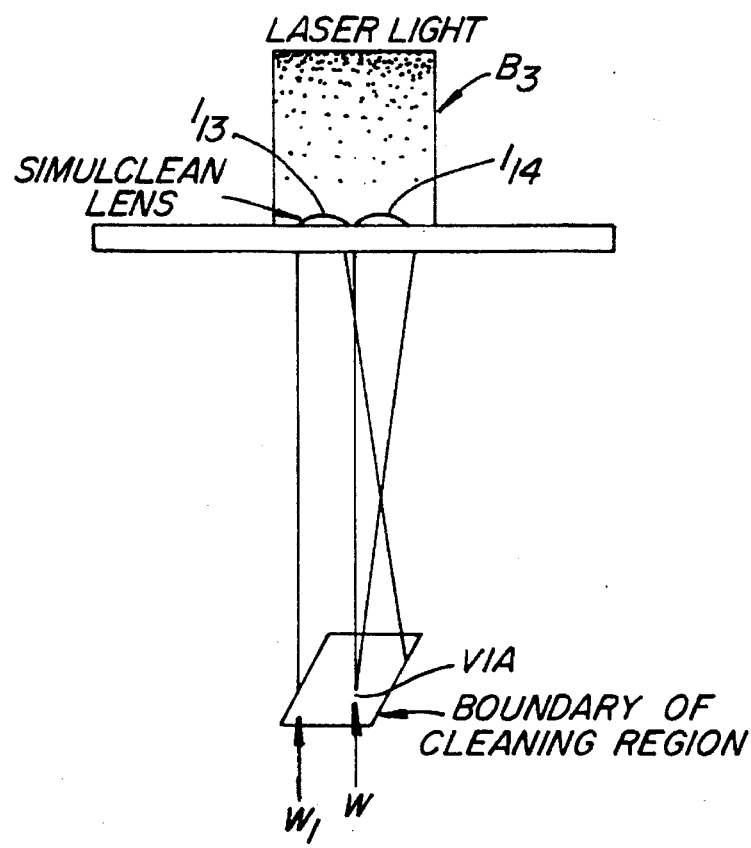

A new method can be utilized to remove debris and promote adhesion around a given via. This much is illustrated in FIGS. 6A and 6B.

Referring to these figures, beam $B_3$ is shown illuminating individual subapertures $I_{13}$–$I_{14}$. Individual subapertures $I_{13}$ impacts an area $W_1$. The lower intensity laser light operates by illuminating the region around a via with lower intensity light. This laser light will then clean debris off the surface. Additionally, it can serve to roughen the surface substrate S. A lens design is shown in FIGS. 6A and 6B with the via and cleaned region around it. In the example shown the incident fluence on the mask is $10^{-2}$ J/cm$^2$, with a lens gain about $10^2$, and the area ablation having a gain of about 10. Hence, the fluence in the surrounding region is 0.1 J/cm$^2$ as contrasted to 1 J/cm$^2$ to form the via.

Figure 6C:
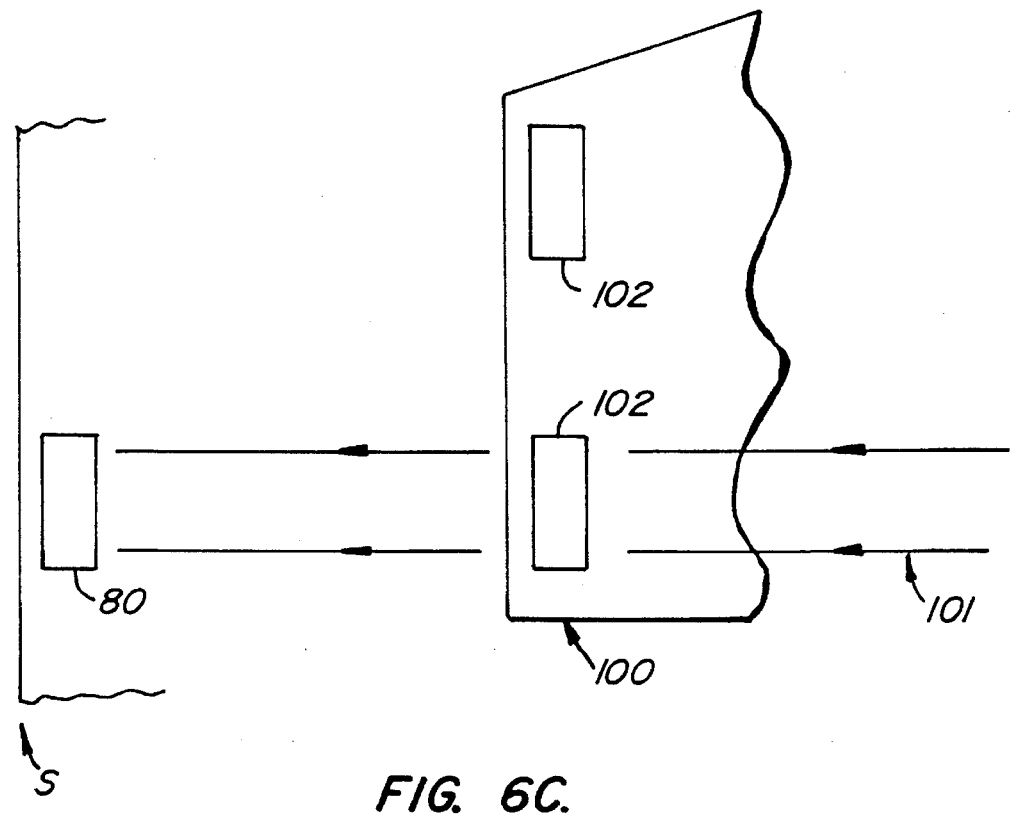
FIG. 6C is a perspective view of a vertically disposed substrate and molybdenum mask used for the purpose of pad clearing.

Referring to FIG. 6C and with respect to pad clearing, there are a number of ways this can be done. One of them is just having molybdenum masks 100 whose form is close to that of the pads 80 being made lie in proximity that is only a 1 or 2, or maybe at most 5 millimeters from the surface of the substrate S. Openings 102 of this metal mask are aligned approximately with those of the underlying pads. This is possible because the pads themselves are rather large structures, typically on the order of 5–20 mil. After that, a laser beam 101, which can be concentrated by the beam compressor is just swept over the openings in an approximate manner. The beam will simply be scanned. The edge definition is then provided by molybdenum mask 100.

In addition to this technique, a dedicated phase mask M with correspondingly dedicated individual subapertures I again could be used for pad clearing. And again, if dedicated tool in either the form of a proximity plate or a dedicated phase mask is not called for because of the size of the production lot, the tool can be used in prototyping mode to individually clear the pads of material.

Additionally, in FIG. 6C, substrate S is ablated in a vertically disposed position and is shown ablating a vertically disposed substrate. That is to say, substrate S has the surface which is ablated vertically disposed. This enables debris to fall clear after ablation. Further, with the vertically disposed substrate S, debris will neither fall on substrate S, mask M or on variable aperture $A_V$.

Figure 7A:
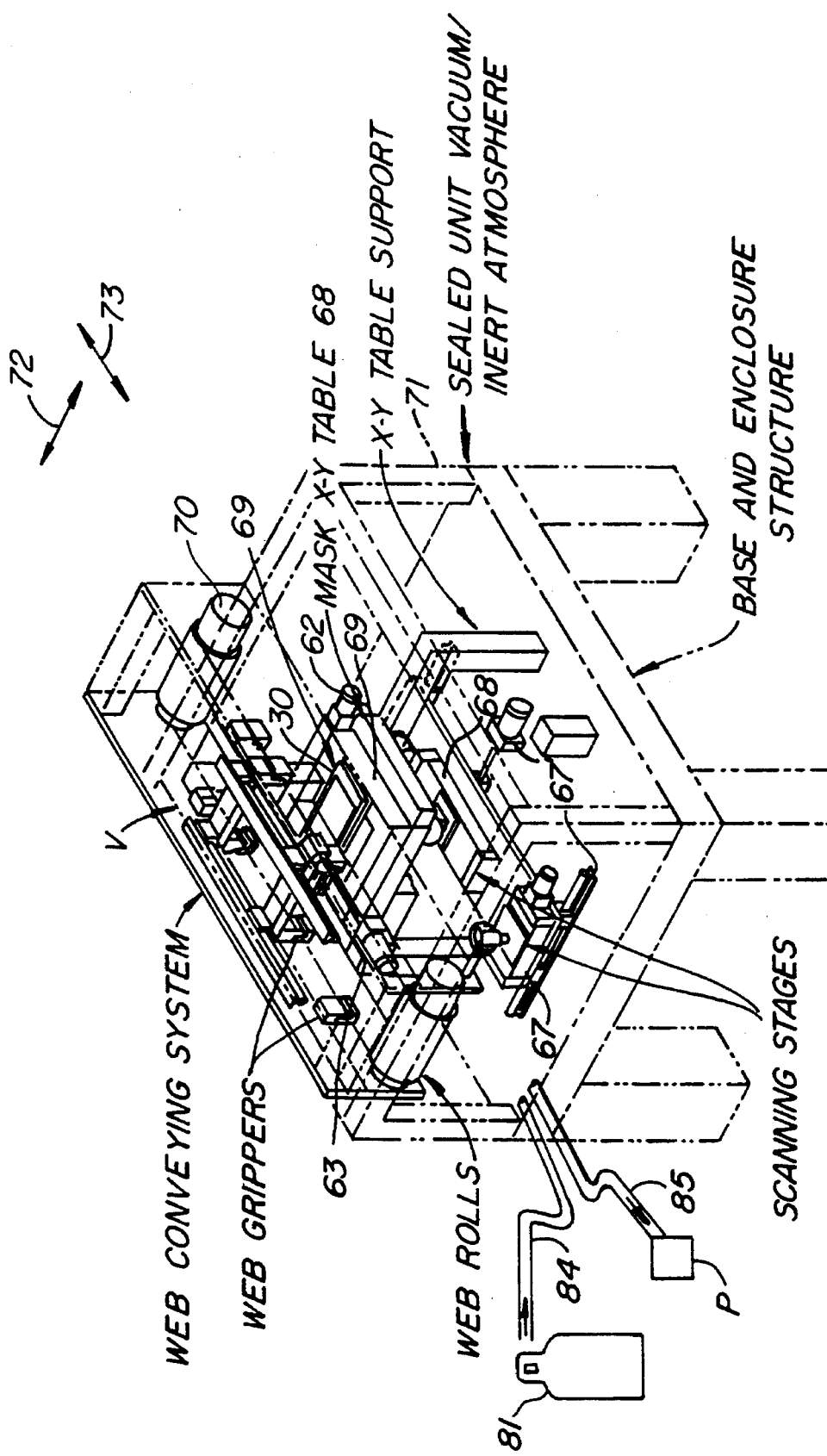
FIG. 7A is a perspective view of the scanners, mask holder and table, and workpiece arrangement in a machine incorporating the apparatus and process of this invention.
Figure 7B:
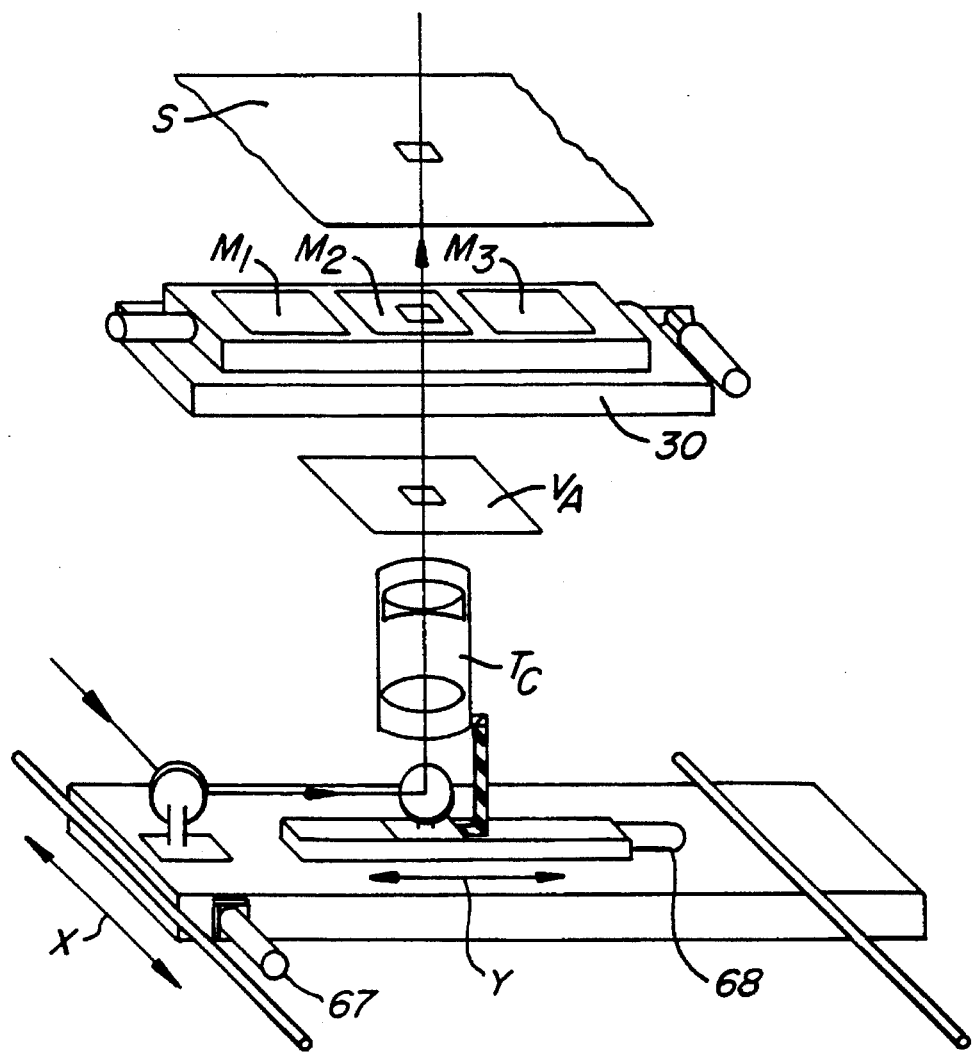
FIG. 7B is a detailed view of the machine of FIG. 7A in the vicinity of the scanning stages and masks illustrating in exploded format the X and Y scanners, the compression telescope riding on the Y scanning stage, and variable aperture for trimming the size of the beam incident on the substrate to avoid partial scanning of subapertures that are adjacent the particular subaperture group being scanned, and the masks mounted in a tray that provides for both X and Y translation.

An alternate to this arrangement will be seen with respect to FIGS. 7A and 7B. There ablation occurs upside down. The reader will understand that any ablation which disposes the substrate so that the generated debris falls clear of the substrate is intended to be included herein.

The reader will understand that this ablation is particularly useful for "clearing" pads for subsequent electrical contact. Frequently when so-called "webs" are fabricated, pads intended for electrical contact become covered with debris. This debris interferes with the required electrical contact with the result that product, otherwise useful is rejected. We here contemplate utilizing the disclosed ablation apparatus and method for clearing such pads. This much is specifically shown in FIG. 6C.

It usually is desirable to effect ablation of substrate S in a controlled atmospheric environment. Referring to FIG. 7A, chamber 71 with window is provided for entering light. Atmosphere control occurs through inlet line 84 and outlet line 85. As will be apparent, evacuation of debris and gases of ablation will occur.

It will be understood that we contemplate such controlled atmospheres to contain either a vacuum or various gases including inert gases such as helium. For this reason, such apparatus is schematically disclosed in FIG. 7A to include pump P and source 81 which can either be a gas or air source.

Referring to FIG. 7A and 7B, we have found that ablation either from underneath a substrate S or to the side of a vertically disposed substrate S is preferred. The reader will observe that in FIG. 6C has the ablation illustrated on the side of the vertically disposed substrate. In this disposition, debris does not fall onto the individual subaperture I or onto the substrate S.

The laser illumination can also be directed upwards to the workpiece. In the preferred embodiment, the environment can be either Helium or vacuum. For vacuum, good results are obtained below 1 torr and at high precision. Such a vacuum chamber is schematically shown at chamber H in FIG. 1 and illustrated in part at FIG. 7A. This "upside-down" configuration is beneficial for both the cutouts and debris removal.

FIG. 7A is a perspective schematic of a reel handling system. This differs from usual configuration in several respects. Reel handling unit 70 has a supply reel and a take up reel. Reel handling unit 70 is mounted rigidly to the table; that is reel handling unit 70 is never moved, only supply and takeup reels move.

Addressability of the substrate S by the mask comes from stages 62–63 which translate mask M and variable aperture $A_V$ over the reel to the necessary position for processing substrate S.

Referring further to FIG. 7A, several innovative features will be noted. First all of the beam conditioning optics, laser beam conditioning optics, z path stage, power meters, spatial filters, expansion telescopes are all disposed before the illustrated vacuum table V. They are not shown in FIG. 7A.

The optics consists of two scanning stages. X-scanning stage 67, Y-scanning stage 68, compression telescope $T_C$ attached to Y-scanning stage 68 and mask M in tray 30.

Scanning stages 67 and 68 represent a considerable improvement. In previous scanning devices, the beam is scanned over large mirrors and similar optics. This is not the case in the arrangement shown in FIG. 7A and 7B. Specifically, X-scanning stage 67 carries Y-scanning stage 68. Additionally, compression telescope $T_C$ is mounted to Y-scanning stage 68 immediate above the mirror producing deflection at the stage. The area that the scanned laser beam can address is not limited to the size of the largest optic in the beam train. With this configuration, limitation occurs only by the travel allowed by the X-scanning stage 67 and Y-scanning stage 68. It can be seen that the mirrors have approximately a diameter the same as the scanning beam diameter.

It will be seen that X-scanning stage 67 is a large stage that allows for motion in one transverse direction, here the X-direction. Y-scanning stage 68 has movement on X-scanning stage 67. Tray 30 has small movement allowance on stages 62'–63 just so that you can quickly address the beam on the phase mask. All of the elements here, scanners, XY stage, web are all encased in an environment that can be either evacuated mostly of air or put in an inert atmosphere helium, nitrogen or argon. This is not shown in the view of FIG. 7B.

Additionally, illustrated here would be the alignment consisting of an off set microscope in the hole inside the XY mask table 69. Not shown are blowers used to knock debris such as slugs off of the masks. Slugs are just bits of material usually 10 mil circles or other shapes of masks that are blown out of the web.

Figure 9:
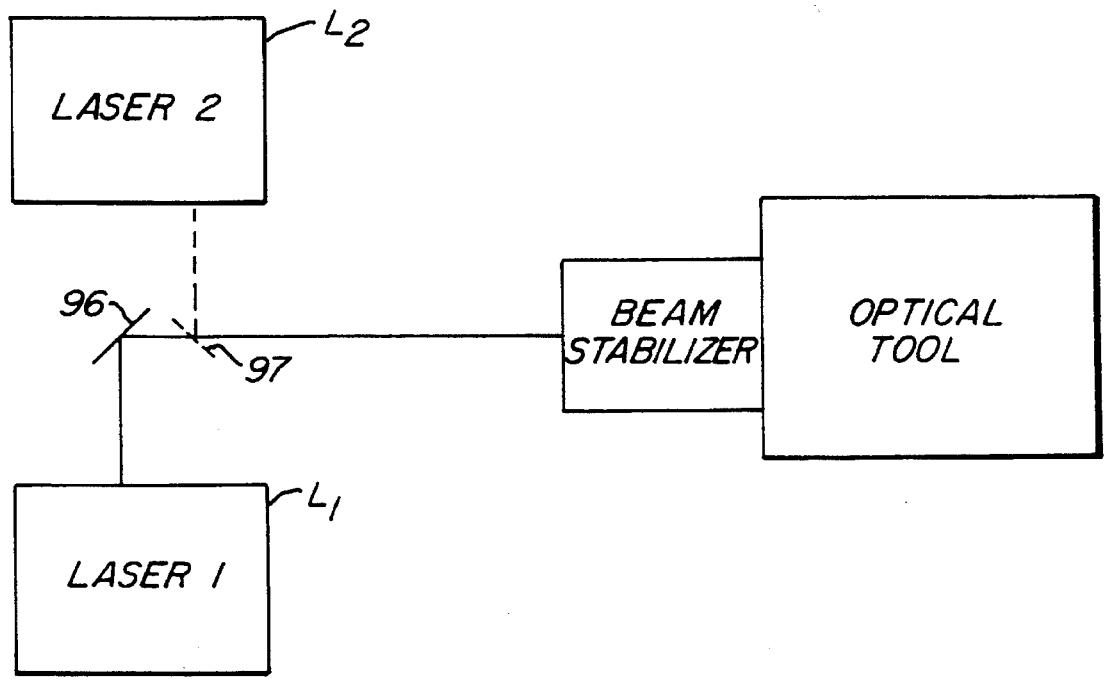
FIG. 9 illustrates a dual laser power source for providing redundancy in laser power during operation of the apparatus of this invention.

Referring to FIG. 9, two lasers $L_1$ and $L_2$ are illustrated to minimize the tool downtime due to laser malfunctions or scheduled maintenance on the laser. That is done by having the two lasers. Laser $L_1$ is the primary laser. Whenever it requires scheduled or unscheduled maintenance a mirror 97, kinematically mounted, can be put on a small optical bench so that the laser $L_2$ can then be utilized by the tool. The tool itself will generally have a laser beam pointing stabilizer to get rid of angular fluctuations in the gross output of the laser beam usually due to heating.

The lasers $L_1$, $L_2$ are electrically, mechanically and optically separated to prevent common path failure. With this kind of arrangement you could switch over from one laser to another in something like 1 minute thereby minimizing tool downtime.

In addition to XY translation, a rotation table capable of at least small angular deflections are used in aligning the phase mask better to underlying structures on the workpiece.

The illustrated apparatus can also be utilized for "via" formation. Now by using the term "via" rather broadly to describe not only circular holes that are ablated where 100% of the area is ablated, but excised holes as well as more complicated shapes. This covers not only solidly ablated holes, but also vias formed with axicons, that is vias in which the circular holes in which only the perimeter of the holes ablated in the interior or slug falls out of the middle. In addition to these circular shapes, either solidly or ablated or excised and it can include squares, triangles, and more complicated shapes that can be generated by a single element or collection of elements, so that's what via formation would be. It just amounts to patterning either through holes in materials like polyimide or blind holes or structures that are a stop on copper.

For the via formation, typically you would use a dedicated mask wherein either one or several masks produces the desired pattern; the only movement being what is required to register each mask to the workpiece. So, for instance, you might shoot 500 vias, all registered relative to one another with a single mask. The only alignment that need be done is to register that whole group of 500 with respect to an underlying structure, and then another group of 500 might be done using a different mask the same way.

It will be understood that the tool can also be utilized for excision. Excision is just a process of cutting out an outline of material, and oftentimes the piece of material that is cut out, what would be the slug for via formation, is the part that you end up saving. The large, square cut-out might be the product. Such an ablation and how it contrasts with the ablation of a normal via is illustrated in FIGS. 4A and 4B.

Figure 4A:
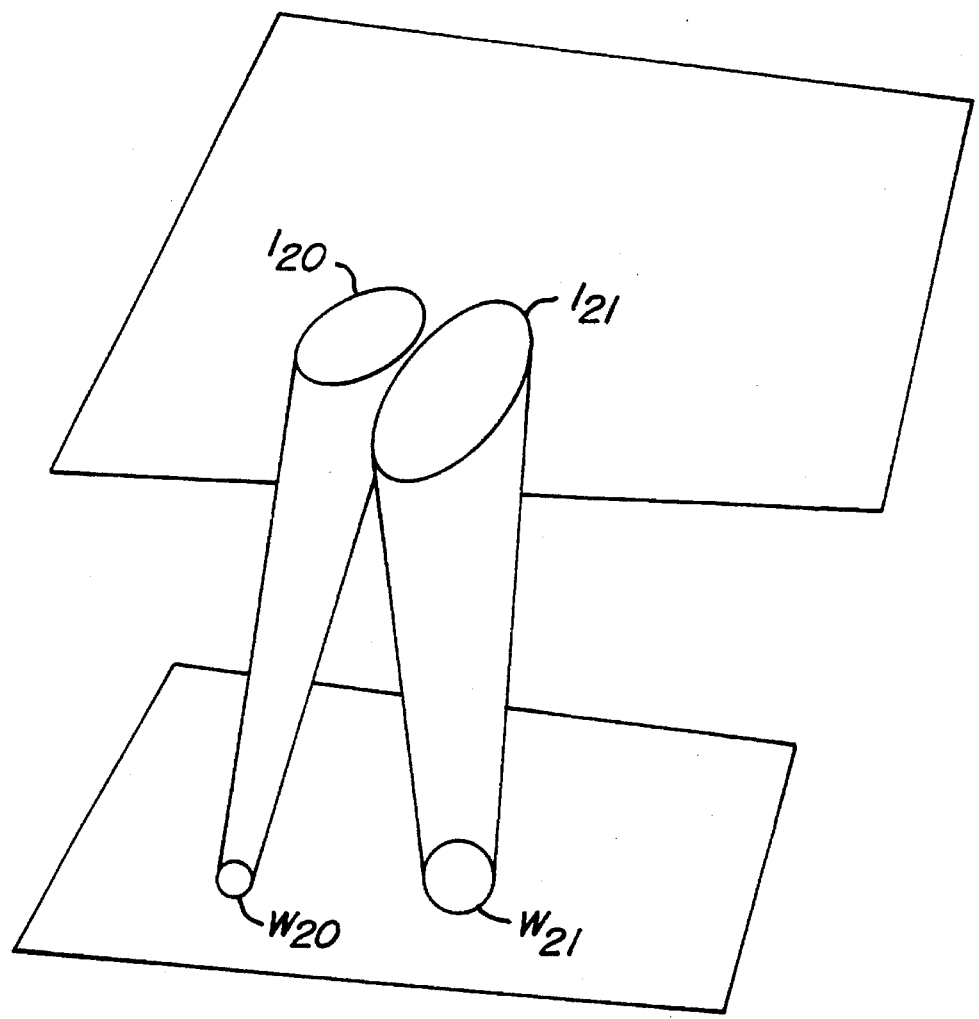
FIG. 4A is a perspective view of an overlying plate having two subapertures with the first subaperture ablating a via and the second subaperture segment excising a circular area.
Figure 4B:
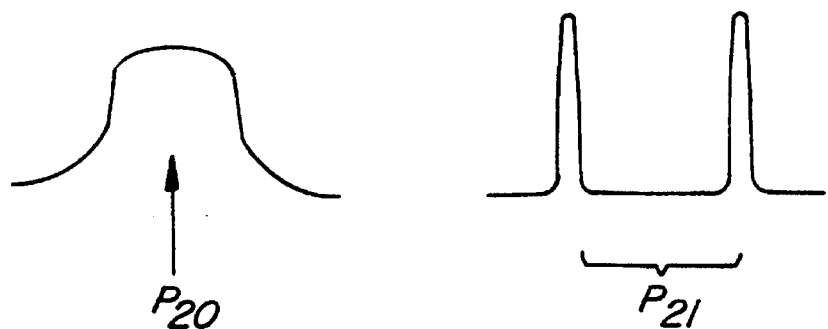
FIG. 4B is an intensity profile underlying the subapertures of FIG. 4A with the respective profiles shown for solid ablation and excision.

Referring to FIG. 4A, two adjacent individual subapertures $I_{20}$–$I_{21}$ are illustrated. These individual subapertures produce respective working images $W_{20}$–$W_{21}$, which are respectively a via and a so-called "ring of fire" producing a circular excision. It will be understood that the circular excision can either be waste—or alternatively the product desired. FIG. 4B maps the intensity profile for the via and circular excision—taken at a diameter of the circular excision.

Figure 8A:
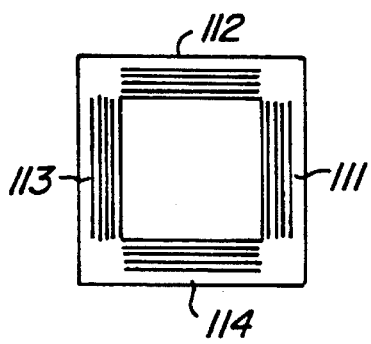
FIG. 8A and 8B are respective views of an ablating plate and excised area in which a circuit is excised from a substrate.
Figure 8B:
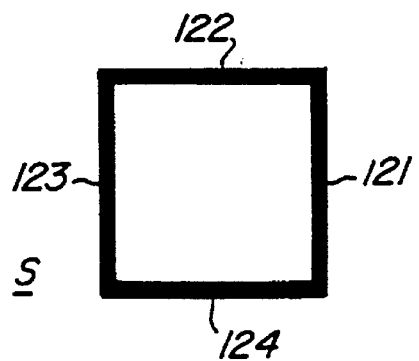

It is just as clear that all excisions do not have to be circular. A mask M is illustrated in FIG. 8A with a square excision is shown in FIG. 8B. It will be understood that the central portion of FIG. 8B could well encompass a circuit, this circuit not being shown.

Referring to FIG. 8A, the mask M is illustrated. It includes four subapertures 111–114 which ablate boundaries 121–124 on substrate S.

It is not limited to the square cut-outs. It could be a much more intricate sort of shape. The cutting of more intricate shapes is not the subject of this application.

Figure 10A:
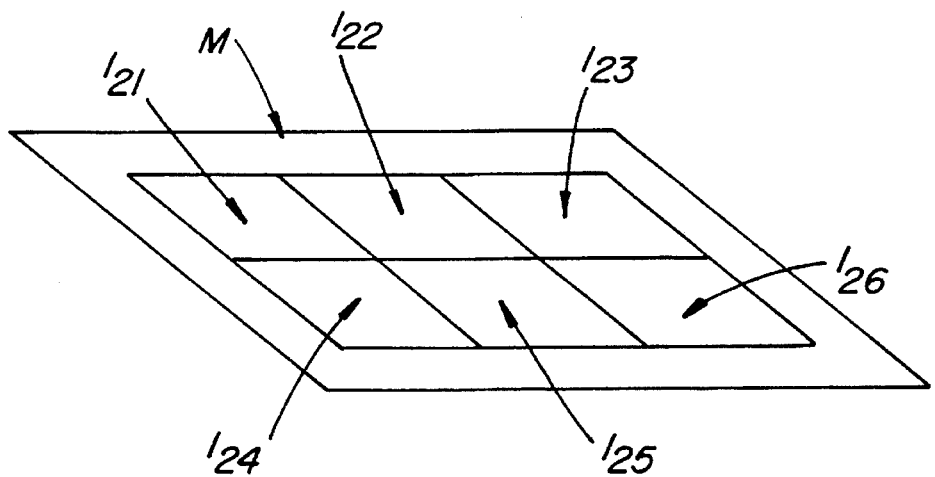
FIGS. 10A and 10B are respective illustrations of a phase mask and substrate in which subapertures can be selected for creating arbitrary shaped vias within the substrate; and, FIG. 11 is a plan view of a mask taken from our previously filed Generalized Geometric Transforms for Computer Generated Holograms, filed Dec. 29, 1993 as Ser. No. 08/175,052 illustrating a technique of tiling of adjacent subapertures which permits the illustrated mask to be efficiently tiled.
Figure 10B:
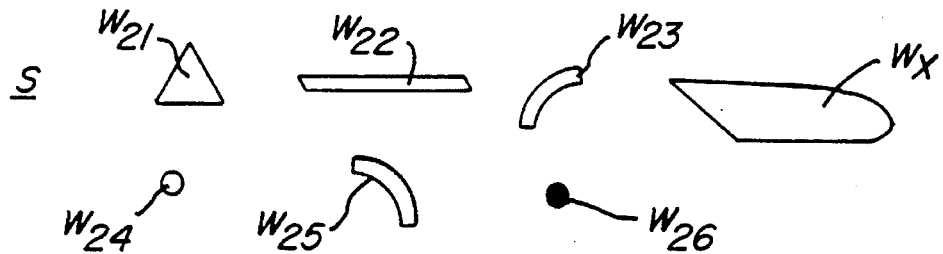

Referring to FIGS. 10A and 10B, the subject of "prototyping" is set forth. In these figures, individual subapertures $I_{21}$–$I_{26}$ act as shape generators. They produce respective working images $W_{21}$–$W_{26}$. Simply stated, by sequentially registering these representative individual subapertures I, arbitrary shapes such as working images $W_X$ can be created.

It will be understood that called shape generators, which, when addressed by the laser beam, produce by themselves a distinct shape, their own distinct shape on substrate S. By having a number of these different shapes and sizes of, for example, vias, via diameters, on a single phase mask, a laser can address each separate shape generator and by moving the underlying table around in X, Y, and Θ, the location of the shape can be varied. In this way, a complex pattern can be built that is useful in prototyping operations or when small production lots are desired. The kind of shapes that can be produced can be circular vias. They could be line segments to produce, for example, a programmable excision pattern. They could become more complicated shapes as well—letters, numerals, for producing a custom product.

Figure 11:
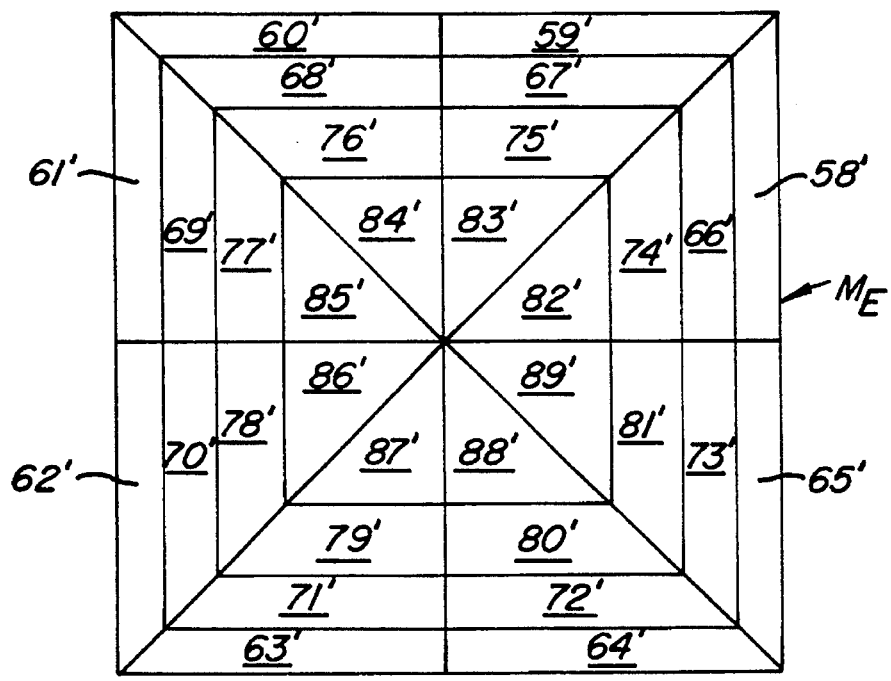

Regarding masks M, it is important that the subapertures place on such masks be resident with optimum efficiency. Accordingly, in FIG. 11, we illustrate a mask $M_E$ having subapertures 58'–89' "tiled" in accordance with the teachings of our copending U.S. patent application Ser. No. 08/175,052 entitled Generalized Geometric Transforms for Computer Generated Holograms. This application is incorporated herein by reference as fully set forth.

Regarding the subapertures, it will be observed that the mask includes contiguous polygon bounded subaperture groups with a plurality of discrete subapertures contained therein. These subaperture groups having polygon boundaries which are either common boundaries with adjacent polygon subapertures or boundaries of the working area on said mask. This enables the subaperture groups on the mask to be continuously tiled adjacent other subapertures to form with adjacent subapertures an uninterrupted continuum over the surface of said mask.

What is claimed is:

1. An apparatus for ablating a substrate with a scanning beam of coherent light including a mask and subaperture comprising in combination:

a beam source for emitting coherent light;

means for scanning the coherent light from the beam source over a mask;

a mask defining an area for incidence of a light beam of coherent radiation on the mask, the mask including bounded subaperture groups with a plurality of subapertures contained therein, at least one a computer generated hologram placing optical features on at least one subaperture of the subaperture group to produce a working image from the subaperture;

a variable aperture between the beam source and the mask for selectively and adjustably blocking light from the scanning beam so that certain single subapertures or groups of subapertures and no others are illuminated by the scanning beam.

2. An apparatus for ablating a substrate with a scanning beam of coherent light including a mask and subaperture according to claim 1 and comprising in further combination:

the variable aperture produces rectangles of adjustable size and position.

3. An apparatus for ablating a substrate with a scanning beam of coherent light including a mask and subaperture according to claim 1 and comprising in further combination:

at least one subaperture producing a working image with position relative to the mask outside of the mask relative to the scanning beam;

a negative lens mounted adjacent the mask for causing light incident upon the mask at the subaperture to be diverged relative to the mask.

4. An apparatus for ablating a substrate with a scanning beam of coherent light including a mask and subaperture according to claim 1 and comprising in further combination:

the mask including contiguous polygon bounded subaperture groups with a plurality of discrete subapertures contained therein, the subaperture groups having polygon boundaries which are either common boundaries with adjacent polygon subapertures groups or boundaries on the mask, whereby each said subaperture group on the mask is continuously tiled adjacent other subaperture groups to form with adjacent subapertures an uninterrupted continuum over the mask.

5. An apparatus for ablating a substrate with a scanning beam of coherent light including a mask and subaperture according to claim 1 and comprising in further combination:

the variable aperture being placed between the means for scanning and mask.

6. An apparatus for ablating a substrate with a scanning beam of coherent light including a mask and subaperture according to claim 1 and comprising in further combination:

the substrate being disposed above the mask so that light projected through the mask toward the substrate propagates in a vertical direction.

7. An apparatus for ablating a substrate with a scanning beam of coherent light emanating from a coherent light source and passing through light beam scanning means, the apparatus for ablating including a lens and mask having at least one subaperture comprising combination:

a mask having an area for incidence of a scanning beam of coherent light along a linear path on the mask, the mask including subaperture groups with a plurality of discrete subapertures contained therein, at least one subaperture of the mask including a computer generated hologram for diverging in a first direction light from the scanning beam of coherent light incident upon the mask in a direction away from the linear path of a scanning beam of coherent light on the mask; and, a negative lens mounted adjacent the mask for causing light incident upon the mask at the subaperture to be diverged in the first direction relative to the mask whereby a working image is formed.

8. An apparatus for ablating a substrate with a scanning beam of coherent light emanating from a coherent light source and passing through light beam scanning means, the apparatus for ablating including a lens and mask having at least one subaperture according to claim 7 and comprising in further combination:

a variable aperture between the light beam scanning means and the mask for selectively and adjustably blocking light from the scanning beam so that certain single subapertures or groups of subapertures and no others are illuminated by the scanning beam.

9. An apparatus for ablating a substrate with a scanning beam of coherent light emanating from a coherent light source and passing through light beam scanning means, the apparatus for ablating including a lens and mask having at least one subaperture according to claim 8 and comprising in further combination:

the variable aperture being placed between the light source and mask.

10. An apparatus for ablating a substrate with a scanning beam of coherent light emanating from a coherent light source and passing through light beam scanning means, the apparatus for ablating including a lens and mask having at least one subaperture according to claim 8 and comprising in further combination:

the substrate being disposed above the mask so that light projected through the mask toward the substrate propagates in a vertical direction.

11. An apparatus for ablating a substrate with a scanning beam of coherent light emanating from a coherent light source and passing through light beam scanning means, the apparatus for ablating including a lens and mask having at least one subaperture according to claim 7 and comprising in further combination:

the mask has a dimension which is less than a dimension of the substrate whereby the subaperture on the mask and negative lens must diverge light from subaperture to portions of the substrate outside of an undeviated path of the beam through the mask.

12. An apparatus for processing a plurality of selected locations on a workpiece by projecting arbitrary working patterns onto the workpiece at selected locations, the apparatus comprising:

a light source for generating an incident processing beam;

a mask having an array of diffractive regions, each diffractive region causing light to generate at a discrete distance from the mask a working image for processing the workpiece;

means for scanning light from the light source over the mask in at least two dimensions, the means for scanning including;

a beam expanding telescope for outputting an expanded incident processing beam to a scanning stage;

a first scanning stage for scanning the expanded incident processing beam in a first dimension;

a second scanning stage mounted to the first scanning stage for moving in scan with the first scanning stage in the first dimension and scanning on the first scanning stage in the second dimension; and, a compression telescope for receiving the expanded incident processing beam and compressing the incident processing beam upon exit from the second scanning stage.

13. An apparatus for processing a plurality of selected locations on a workpiece by projecting arbitrary working patterns onto the workpiece at selected locations according to claim 12, the apparatus comprising in further combination:

the light source for generating an incident processing beam has a preselected beam diameter; and, the means for scanning includes mirrors having approximately a preselected mirror diameter as the preselected beam diameter.

14. An apparatus for processing a plurality of selected locations on a workpiece by projecting arbitrary working patterns onto the workpiece at selected locations according to claim 12, the apparatus comprising in further combination:

the workpiece being disposed above the mask so that light projected through the mask toward the workpiece propagates in a vertical direction.

15. An apparatus for processing a plurality of selected locations on a workpiece by projecting arbitrary working patterns onto the workpiece at selected locations according to claim 14, the apparatus comprising in further combination:

the compression telescope having an inlet aperture larger than the incident processing beam is placed in before the mask.

16. An apparatus for processing a plurality of selected locations on a workpiece by projecting arbitrary working patterns onto the workpiece at selected locations according to claim 15, the apparatus comprising in further combination:

the compression telescope is affixed to the second scanning stage.

17. An apparatus for processing a plurality of selected locations on a workpiece by projecting arbitrary working patterns onto the workpiece at selected locations according to claim 16, the apparatus comprising in further combination:

the compression telescope has a receiving aperture approximately a size of the incident processing beam.

18. An apparatus for excising selected locations on a workpiece having an excision boundary including straight lines and curved lines in combination within a single excision boundary by projecting excision segments onto the workpiece at selected locations to construct from a plurality of such segments a continuous excision boundary, the apparatus comprising:

a light source for generating an incident processing beam;

a mask having an array of diffractive regions, each diffractive region causing light to generate at least one excision boundary segment at a discrete distance from the mask in a working image for excising a portion of the workpiece;

the excision boundary segments including straight and curved lines which when placed to a workpiece excise a location which is other than a circle or a rectangle;

means for scanning light from the light source over the mask to project the excision boundary to the workpiece for excision of the substrate.

* * * * *